United States Patent
Masaki et al.

(10) Patent No.: US 8,426,323 B2
(45) Date of Patent: Apr. 23, 2013

(54) SUBSTRATE PROCESSING APPARATUS, SUBSTRATE ANNEALING METHOD, AND SEMICONDUCTOR DEVICE MANUFACTURING METHOD

(75) Inventors: Nobuyuki Masaki, Saitama-ken (JP); Yuichi Sasuga, Yamanashi-ken (JP); Masami Shibagaki, Fuchu (JP); Hiroshi Doi, Chofu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 713 days.

(21) Appl. No.: 12/636,928

(22) Filed: Dec. 14, 2009

(65) Prior Publication Data

US 2010/0151695 A1 Jun. 17, 2010

(30) Foreign Application Priority Data

Dec. 15, 2008 (JP) .................................. 2008-318426
Dec. 7, 2009 (JP) .................................. 2009-278040

(51) Int. Cl.
*H01L 21/00* (2006.01)
*B05C 11/11* (2006.01)

(52) U.S. Cl.
USPC ........................... 438/795; 118/504; 392/416

(58) Field of Classification Search .................. 438/795; 118/504, 635; 392/416
See application file for complete search history.

(56) References Cited

U.S. PATENT DOCUMENTS

| 6,410,888 | B2 * | 6/2002 | Pan ................................ 219/390 |
| 7,045,746 | B2 * | 5/2006 | Devine et al. .................. 219/411 |
| 7,091,453 | B2 * | 8/2006 | Murayama et al. ........... 219/390 |
| 2001/0012697 | A1 * | 8/2001 | Mikata .......................... 438/758 |
| 2003/0089698 | A1 * | 5/2003 | Ratliff et al. .................. 219/390 |
| 2007/0178225 | A1 * | 8/2007 | Takanosu et al. ............... 427/69 |
| 2009/0190908 | A1 | 7/2009 | Shibagaki ...................... 392/416 |
| 2009/0191724 | A1 | 7/2009 | Shibagaki et al. ............. 438/796 |
| 2009/0202231 | A1 | 8/2009 | Shibagaki et al. ............. 392/416 |
| 2009/0218579 | A1 | 9/2009 | Shibagaki ........................ 257/77 |

FOREIGN PATENT DOCUMENTS

| JP | 58-110032 | 6/1983 |
| JP | 2003-318076 A | 11/2003 |
| WO | 2008/123111 A | 10/2008 |
| WO | 2009/031450 A | 3/2009 |

* cited by examiner

*Primary Examiner* — William D Coleman
(74) *Attorney, Agent, or Firm* — Fitzpatrick, Cella, Harper & Scinto

(57) ABSTRACT

A substrate processing apparatus includes a chamber capable of being evacuated, a substrate stage adapted to mount a substrate, a heating unit adapted to be set above the substrate mounting surface of the substrate stage, face the substrate mounted on at least the substrate mounting surface, and heat the substrate by radiant heat without being in contact with the substrate, a shutter adapted to be retractably inserted in the space between the heating unit and the substrate mounted on the substrate mounting surface, and a shutter driving unit adapted to extend/retract the shutter into/from the space. The substrate is mounted on the substrate stage to face the heating unit, the substrate is annealed by heating the substrate by radiant heat from the heating unit, and the shutter is extended into the space between the heating unit and the substrate stage.

7 Claims, 4 Drawing Sheets

SUBSTRATE PROCESSING APPARATUS, SUBSTRATE ANNEALING METHOD, AND SEMICONDUCTOR DEVICE MANUFACTURING METHOD

BACKGROUND OF THE INVENTION

1. Field of the Invention

The present invention relates to a substrate processing apparatus, a substrate annealing method, and a semiconductor device manufacturing method and, more particularly, to a substrate processing apparatus, substrate annealing method, and semiconductor device manufacturing method used in, for example, annealing a silicon carbide (SiC) substrate.

2. Description of the Related Art

A conventionally known substrate processing apparatus includes a heating plate, annular cooling unit, and substrate holder. The heating plate is set in the lower portion of a vacuum chamber. The cooling unit is set in the upper portion of the vacuum chamber. The substrate holder is made of a material with a high thermal conductivity and is inserted between the heating plate and the cooling unit to be liftable (see, e.g., Japanese Patent Laid-Open No. 2003-318076). The substrate processing apparatus anneals a substrate by lowering the substrate holder which mounts the substrate to bring the lower surface of the substrate holder into contact with the heating plate, and heating the substrate through the substrate holder. The substrate processing apparatus then cools the substrate through the substrate holder by lifting the substrate holder to bring the periphery of the substrate holder into contact with the cooling unit.

However, note that the above-mentioned conventional substrate processing apparatus, substrate annealing method, and semiconductor device manufacturing method heat the substrate through the substrate holder by heat transfer between them. For this reason, heating nonuniformity may occur unless the substrate is uniformly in contact with the substrate holder throughout the entire contact portion. When, for example, the substrate having undergone implantation and annealing is warped, and portions in which the substrate is in contact and not in contact with the substrate holder are often generated. This may deteriorate the in-plane uniformity of the annealing characteristic of the heated substrate. Note also that the substrate cools from the periphery of the substrate holder. For this reason, the substrate not only cannot uniformly cool the entire surface but also requires a long cooling time, that is, the conventional apparatus undesirably has low productivity to satisfactorily function as a substrate processing apparatus or semiconductor manufacturing apparatus.

SUMMARY OF THE INVENTION

The present invention has been made in consideration of the above-described conventional problems, and provides a substrate processing apparatus and substrate annealing method which can uniformly and rapidly heat the entire substrate and rapidly cool the entire heated substrate.

According to one aspect of the present invention, there is provided a substrate processing apparatus comprising:

a chamber capable of being evacuated;

a substrate stage adapted to, in the chamber, mount a substrate;

a heating unit adapted to, in the chamber, be set above a substrate mounting surface of the substrate stage, face the substrate mounted on at least the substrate mounting surface, and heat the substrate by radiant heat without being in contact with the substrate;

a shutter adapted to, in the chamber, be retractably inserted in a space between the heating unit and the substrate mounted on the substrate mounting surface; and a shutter driving unit adapted to, in the chamber, extend/retract the shutter into/from the space, wherein the shutter has a first principal surface serving as a heat reflecting surface, and a second principal surface serving as a heat absorbing surface, the shutter is disposed such that the first principal surface faces the heating unit and the second principal surface faces the substrate stage when the shutter extends into the space, and the shutter includes a first cooling unit adapted to have an outer periphery surrounded by a sealing member.

According to another aspect of the present invention, there is provided a substrate processing apparatus comprising:

a chamber capable of being evacuated;

a substrate stage adapted to, in the chamber, mount a substrate;

a heating unit adapted to, in the chamber, be set above a substrate mounting surface of the substrate stage, face the substrate mounted on at least the substrate mounting surface, and heat the substrate by radiant heat without being in contact with the substrate;

a shutter adapted to, in the chamber, be retractably inserted in a space between the heating unit and the substrate mounted on the substrate mounting surface; and a shutter driving unit adapted to, in the chamber, extend/retract the shutter into/from the space;

wherein the shutter has a first principal surface serving as a heat reflecting surface, and a second principal surface serving as a heat absorbing surface, the shutter is disposed such that the first principal surface faces the heating unit and the second principal surface faces the substrate stage when the shutter extends into the space, the shutter includes a first cooling unit adapted to have an outer periphery surrounded by a sealing member, and the substrate stage includes a second cooling unit adapted to be positioned on a side opposite to a side on which the heating unit is disposed with respect to the substrate stage.

According to still another aspect of the present invention, there is provided a substrate annealing method, the method comprising the steps of:

mounting the substrate on the substrate stage to face the heating unit using a substrate processing apparatus defined in the above-mentioned one aspect or another aspect of the present invention;

annealing the substrate, mounted on the substrate stage, by heating the substrate by radiant heat from the heating unit using a substrate processing apparatus defined in the above-mentioned one aspect or another aspect of the present invention; and extending the shutter into the space between the heating unit and the substrate stage after the substrate undergoes the annealing using a substrate processing apparatus defined in the above-mentioned one aspect or another aspect of the present invention.

According to yet another aspect of the present invention, there is provided a semiconductor device manufacturing method comprising a step of annealing a substrate using a substrate annealing method defined in the above-mentioned substrate annealing method.

According to the present invention, a substrate can be uniformly and rapidly heated by radiant heat from a heating unit in a chamber capable of being evacuated. The entire substrate stage can be uniformly and rapidly cooled by thermally insulating the substrate stage from the heating unit using a shutter after the heating, and the substrate, in turn, can uniformly and rapidly cool. This makes it possible to improve the productivity of a substrate processing apparatus functioning as a manufacturing apparatus.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1:
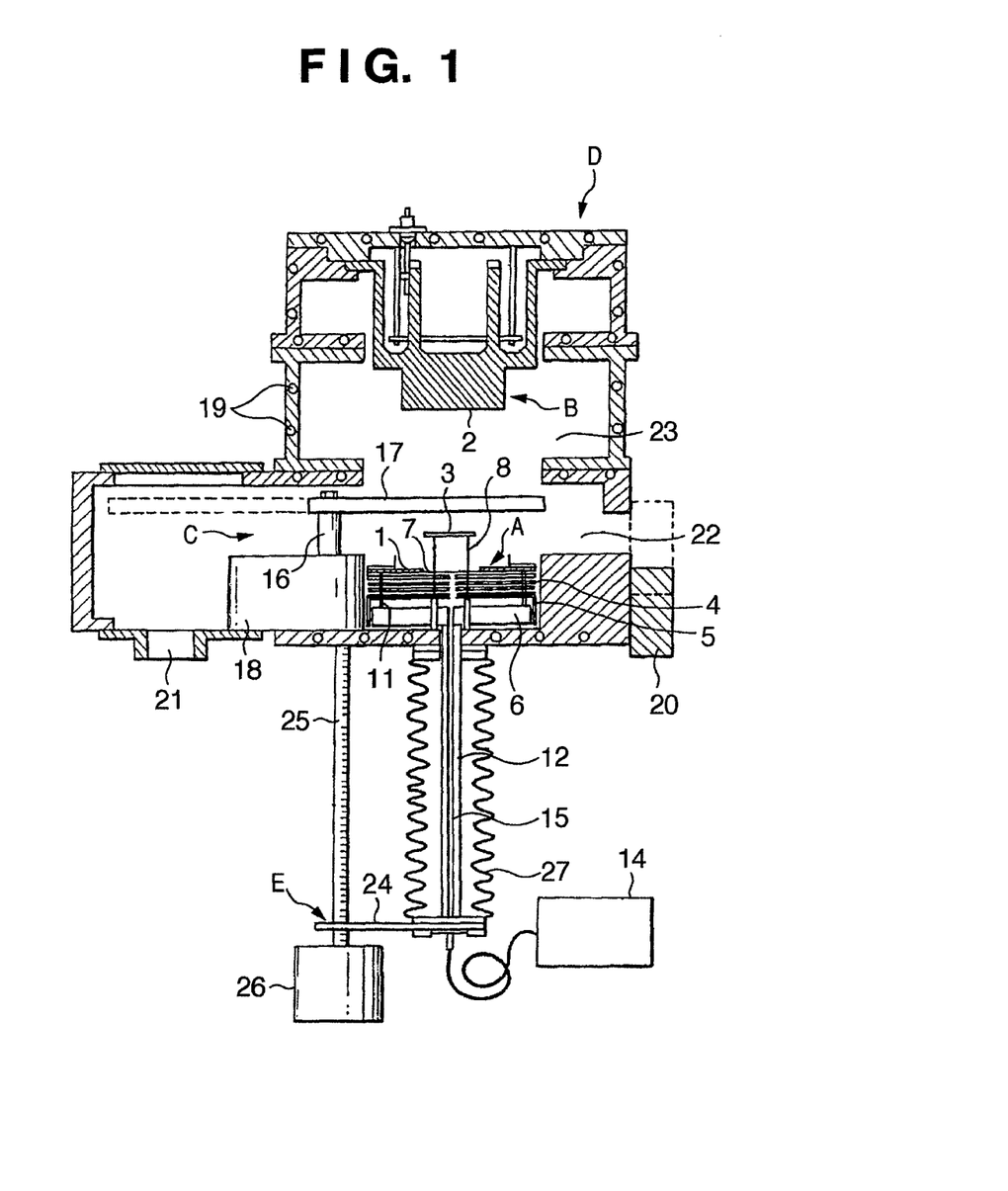
FIG. 1 is a schematic sectional view showing the substrate loading or unloading state of a substrate processing apparatus according to one embodiment of the present invention.
Figure 2:
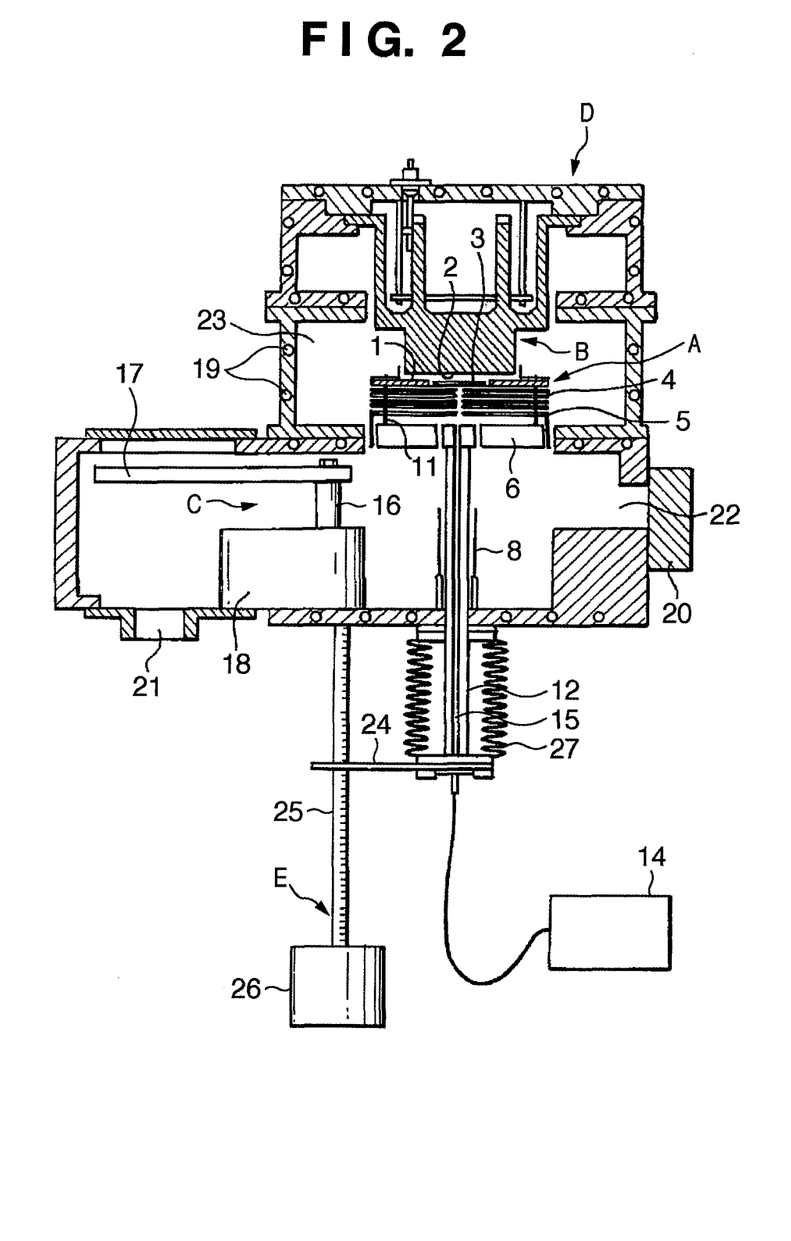
FIG. 2 is a schematic sectional view showing the substrate heating state of the substrate processing apparatus according to this embodiment of the present invention.
Figure 3:
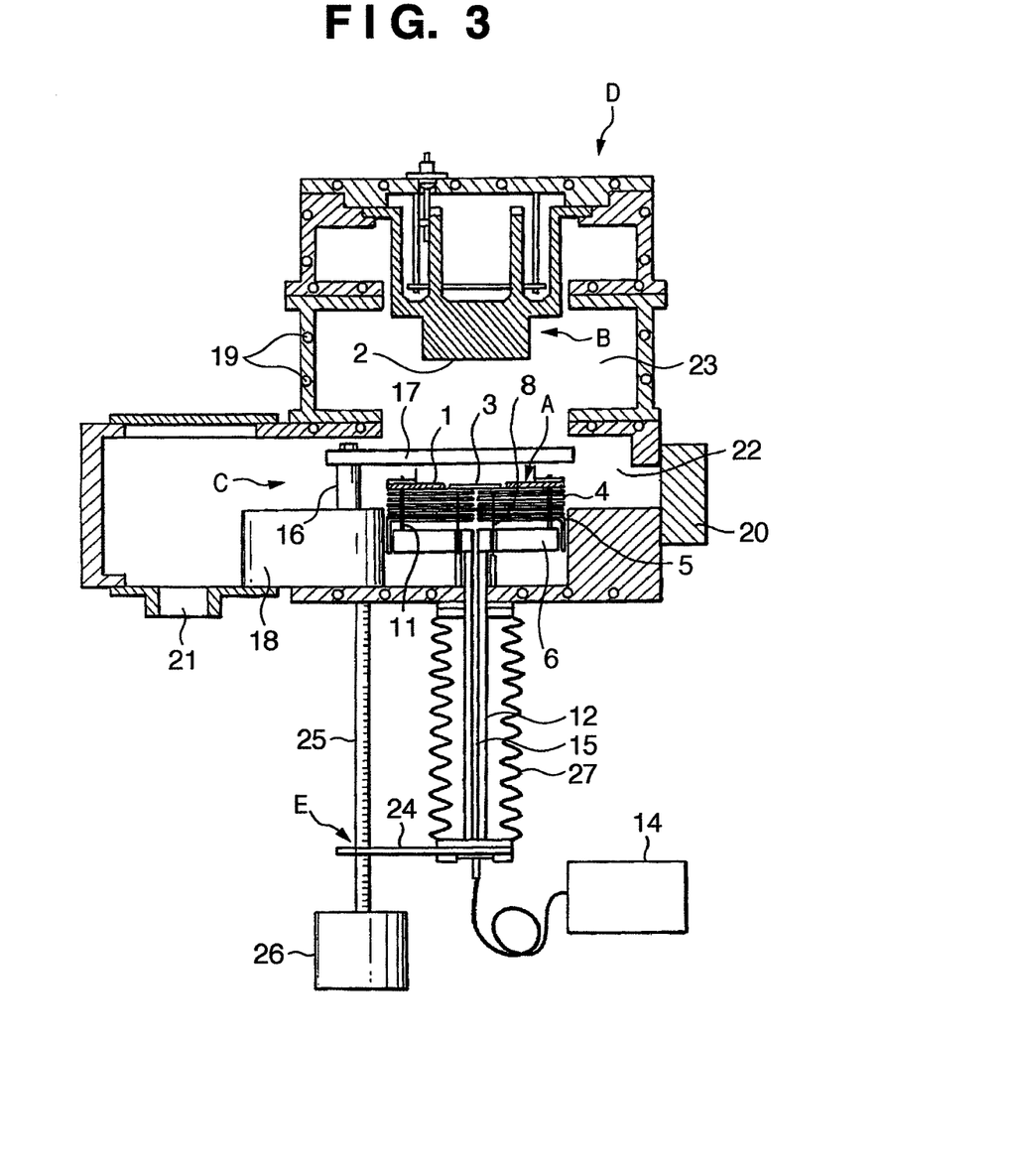
FIG. 3 is a schematic sectional view showing the substrate cooling state of the substrate processing apparatus according to this embodiment of the present invention.

FIG. 1 is a schematic sectional view showing the substrate loading or unloading state of a substrate processing apparatus according to one embodiment of the present invention. FIG. 2 is a schematic sectional view showing the substrate heating state of the substrate processing apparatus according to this embodiment of the present invention. FIG. 3 is a schematic sectional view showing the substrate cooling state of the substrate processing apparatus according to this embodiment of the present invention. Note that the same reference numerals denote the same members or portions throughout FIGS. 1 to 3.

As shown in FIGS. 1 to 3, the substrate processing apparatus according to this embodiment includes a substrate holder mechanism A, heating mechanism B, and shutter mechanism C, which are accommodated in a chamber D.

The substrate holder mechanism A includes a substrate stage 1 in the top stage. The heating mechanism B is set above the substrate stage 1, and has a heat radiating surface 2 facing the substrate stage 1.

The substrate holder mechanism A can be lifted/lowered (vertically moved) by a lift device E to allow the substrate stage 1 to come close to/separate from the heat radiating surface 2 of the heating mechanism B. The heating mechanism B heats the substrate 3 by radiant heat from the heat radiating surface 2 without contact with a substrate 3 on the substrate stage 1 when the substrate holder mechanism A lifts as shown in FIG. 2, and the substrate 3 comes close to the heat radiating surface 2.

The substrate holder mechanism A shown in FIG. 1 is located at a lower position, whereas that shown in FIG. 2 is located at an upper position.

The substrate stage 1 mounts the substrate 3 such that the substrate 3 is located at the center of the upper surface of the substrate stage 1, as shown in FIGS. 2 and 3. Referring to FIG. 1, the substrate 3 is mounted and supported on lift pins 8 in order to load or unload the substrate 3.

The substrate stage 1 is made of a material which has high emissivity, can efficiently absorb radiant heat, can efficiently dissipate the absorbed heat, and has high resistance to high temperatures. More specifically, the substrate stage 1 is a plate-like member made of carbon or a carbon-coated material. Examples of the carbon which forms the substrate stage 1 are glassy carbon, graphite, and pyrolytic carbon. Also, examples of the carbon-coated material are materials obtained by coating ceramics with one type or two or more types of carbon-coated materials.

In addition, the substrate stage 1 is preferably thin in order to suppress its heat capacity to be small and thereby shorten the cooling time. The thickness of the substrate stage 1 changes depending on its constituent material and the amount of recess of a substrate mounting portion 7 (to be described next) as well, and is preferably 2 to 7 mm from the viewpoint of satisfying both assurance of a given strength and shortening of the cooling time. The substrate mounting portion 7 is a recessed portion with its bottom surface serving as a substrate mounting surface.

Four radiating plates 4 and two reflecting plates 5, for example, are inserted between the substrate stage 1 and a cooling panel (serving as a second cooling unit) 6 with spacings between them.

The radiating plates (serving as heat storage units) 4 are plate-like members made of carbon or a carbon-coated material, like the substrate stage 1. The radiating plates 4 are arranged on the lower side of the substrate stage 1 (on the side opposite to that on which the heating mechanism B is disposed with respect to the substrate stage 1) with spacings between them. The radiating plates 4 are located to face the lower surface of the substrate stage 1, and traps (stores) heat dissipated from the lower surface of the substrate stage 1 during heating of the substrate 3. This makes it possible to suppress a drop in temperature of the substrate stage 1 attributed to its heat dissipation, thus facilitating its rapid heating.

Although the radiating plates 4 are not indispensable, they are preferably provided in order to efficiently raise the temperature of the substrate stage 1. When one or more radiating plates 4 are provided, the number of them may be one or a plural number other than four taken in FIGS. 1 to 3 as an example. However, note that providing a plurality of radiating plates 4 makes it possible to rapidly raise the temperature of the substrate stage 1 by relatively thin radiating plates 4. This also makes it possible to suppress the heat capacity of each radiating plate 4 to be small and thereby shorten the cooling time. The thickness of the radiating plates 4 changes depending on the constituent material and number thereof, and is preferably 1 to 3 mm from the viewpoint of satisfying both a rapid rise in temperature upon heating and shortening of the cooling time.

Two reflecting plates 5 are arranged on the lower side of the radiating plates 4 (if there is one radiating plate 4, the lower side of the radiating plate 4, and if there are a plurality of radiating plates 4, the lower side of the lowermost radiating plate 4) with spacings between them. The reflecting plates 5 are made of a refractory metal such as molybdenum or tungsten. At least the surfaces (upper surfaces) on the side of the radiating plates 4 of the reflecting plates 5 have undergone a mirror finish. When one or a plurality of reflecting plates 5 are provided on the lower side of the radiating plates 4, it is easy to suppress a drop in temperature of the substrate stage 1 attributed to its heat dissipation, thus further facilitating its rapid heating. Although the reflecting plates 5 may be omitted, one or a plurality of reflecting plates 5 are preferably provided in order to improve the heating efficiency.

The cooling panel 6 can be disposed on the lower side of the reflecting plates 5 (if there is one reflecting plate 5, the lower side of the reflecting plate 5, and if there are a plurality of reflecting plates 5, the lower side of the lowermost reflecting plate 5) with spacings between them. The cooling panel 6 is a panel body cooled by a cooling mechanism such as a water cooling mechanism. Locating the cooling panel 6 to face the lower surfaces of the substrate stage 1, radiating plates 4, and reflecting plates 5 makes it possible to uniformly and rapidly cool these members positioned above the cooling panel 6 during cooling of the substrate 3. It is also possible to effectively cool the substrate 3 because the substrate stage 1 including the substrate 3 is sandwiched between a shutter 17 and the cooling panel 6.

The radiating plates 4 themselves are not exothermic bodies, so the amount of heat from the heating mechanism B is overwhelmingly large relative to those from the radiating plates 4. In addition, the cooling panel 6 is present below the reflecting plates 5, so it produces only a small cooling effect despite an arrangement in which the cooling panel 6 lifts together with the substrate stage 1 during heating of the substrate 3. For these reasons, the cooling panel 6 may be cooled using water during heating of the substrate 3 as well. In contrast, at the end of heating of the substrate 3, the substrate stage 1 is present below the shutter 17, as shown in FIG. 3, so heat dissipated from the radiating plates 4 accounts for a major share of the total heat. Hence, the cooling panel 6 adjacent to the radiating plates 4 produces a great (cooling) effect at that time. For this reason, in this embodiment, the cooling panel 6 has a structure integrated with the radiating plates 4 and reflecting plates 5. However, the cooling panel 6 can also be set separately from the substrate stage 1, radiating plates 4, and reflecting plates 5. When the radiating plates 4 and reflecting plates 5 are not provided, the cooling panel 6 directly cools the substrate stage 1. In this case, therefore, an arrangement in which the substrate stage 1 comes into contact with the cooling panel 6 upon lowering is desirable, instead of integrating the substrate stage 1 with the cooling panel 6.

The substrate stage 1, radiating plates 4, and reflecting plates 5 described above are supported above the cooling panel 6 by connection screws 11 through heat-resistant/heat-insulating materials such as alumina ceramics or zirconium oxide ceramics. Also, the cooling panel 6 is connected to the distal end of a lift shaft 12 of the lift device E (see FIG. 1). As will be described later, the lift device E vertically moves the lift shaft 12 in its axial direction, and the substrate holder mechanism A lifts/lowers upon vertical movement of the lift shaft 12.

Lift pin through holes (not shown) which run through the substrate stage 1, radiating plates 4, reflecting plates 5, and cooling panel 6 that constitute the substrate holder mechanism A are formed in a plurality of portions in the substrate holder mechanism A. The lift pin through holes (not shown) are especially formed at positions which fall within the mounting portion of the substrate 3 on the substrate stage 1. Also, the plurality of lift pins 8 stand upright at the bottom of the chamber D in correspondence with the positions of the lift pin through holes (not shown). When the substrate stage 1 lifts and so is close to the heating mechanism B, the substrate 3 is separated from the lift pins 8, as shown in FIG. 3.

Immediately below the central portion of the mounting portion of the substrate 3 on the substrate stage 1, a measurement hole 15 is formed to run through the radiating plates 4, reflecting plates 5, and cooling panel 6. The measurement hole 15 is formed at the center of the lift shaft 12. The measurement hole 15 is used to measure heat dissipated from the substrate stage 1 by a temperature measurement device 14 shown in FIG. 1 through, for example, a thermal infrared transmitting window made of quartz.

The heating mechanism B includes the heat radiating surface 2 and a heater for heating the heat radiating surface 2. The heater can be of, for example, the electron bombardment heating scheme, high-frequency induction heating scheme, or resistance heating scheme. The heat radiating surface 2 is a heat-resistant black surface and can be obtained by carbon coating using, for example, glassy carbon, pyrolytic carbon, or amorphous carbon. When the heat radiating surface 2 is such a carbon-coated surface, it is possible to suppress both degassing in a vacuum and particle generation.

The shutter mechanism C can extend the shutter 17 into the space between the substrate stage 1 and the heat radiating surface 2 when the substrate holder mechanism A lowers and so the substrate stage 1 and the heat radiating surface 2 of the heating mechanism B are spaced apart from each other, as shown in FIGS. 1 to 3. The shutter mechanism C includes a shutter driving device 18 and shaft 16 for extending/retracting the shutter 17 into/from that space. The shutter driving device 18 and shaft 16 retractably insert the shutter 17 into the space between the heating mechanism B and the substrate mounted on the substrate mounting surface of the substrate stage 1. The shutter driving device 18 and shaft 16 constitute a shutter driving unit. When the substrate holder mechanism A lifts, the shutter 17 retracts (retreats) from the space between the substrate stage 1 and the heat radiating surface 2, as shown in FIG. 1.

The shutter 17 functions as a thermal barrier wall. That is, as shown in FIGS. 1 and 3, when the substrate holder mechanism A lowers and so the substrate stage 1 and heat radiating surface 2 are spaced apart from each other, the shutter 17 extends into the space between the substrate stage 1 and the heat radiating surface 2 to prevent heat from transferring from the heat radiating surface 2 to the substrate stage 1. To allow the shutter 17 to function as a thermal barrier wall, the principal surface (first principal surface), facing the heating mechanism B, of the shutter 17 desirably serves as a heat reflecting surface. In addition, the principal surface (second principal surface), facing the substrate 3, of the shutter 17 desirably serves as a heat absorbing surface in order to efficiently cool the substrate 3 by absorbing heat from the substrate 3.

Also, when the substrate holder mechanism A lifts, the shutter 17 is rotationally moved by the shutter driving device 18 and so retracts from the space between the substrate stage 1 and the heat radiating surface 2 to a position (indicated by a broken line in FIG. 1) shown in FIG. 2. After the substrate holder mechanism A lifts, the shutter 17 stays in the retracted position until the holder mechanism A lowers again to a position where it does not disturb the operation involved.

The shutter 17 according to this embodiment will be explained in detail herein with reference to FIGS. 4 and 5.

Figure 4:
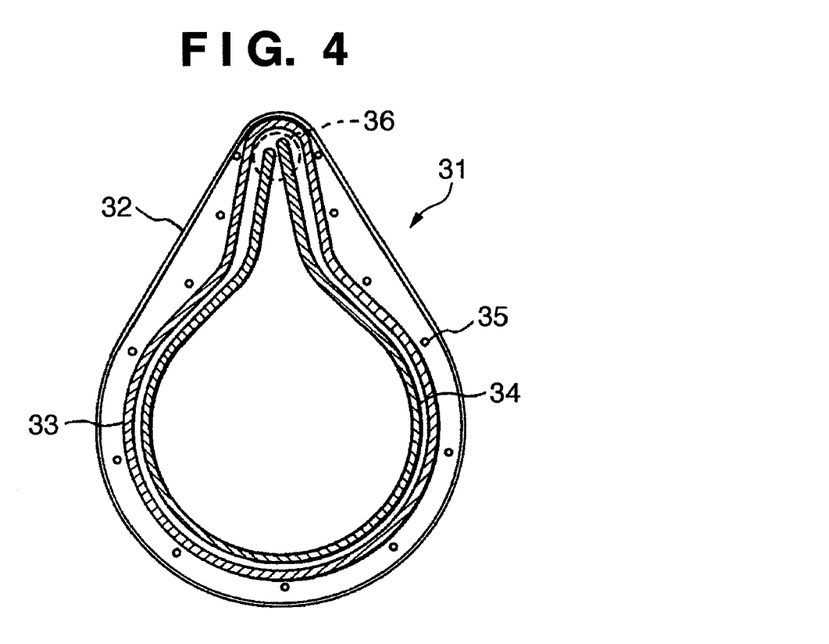
FIG. 4 is an enlarged view of a shutter (lower portion) used in this embodiment.
Figure 5:
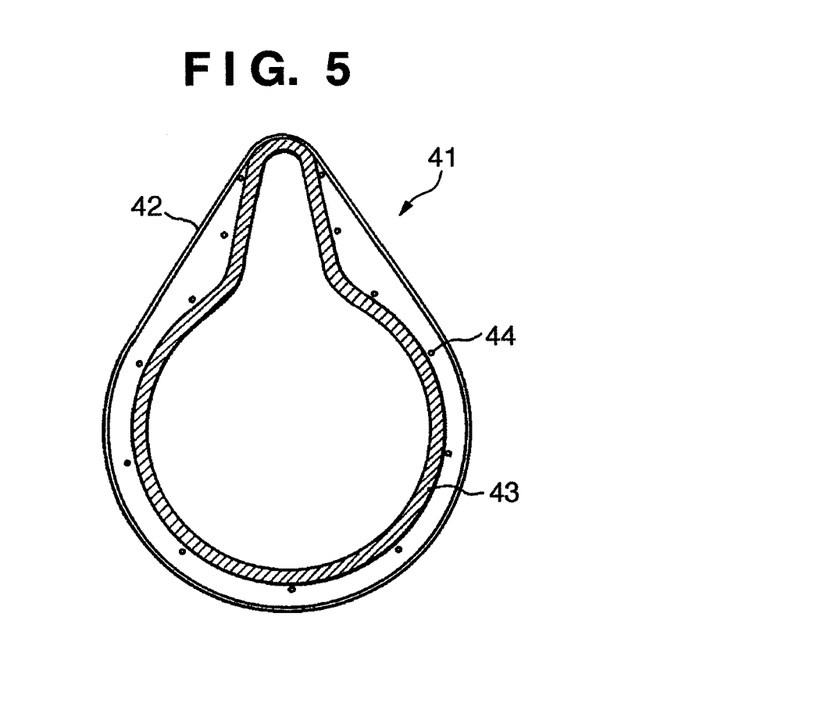
FIG. 5 is an enlarged view of the shutter (upper portion) used in this embodiment.

FIGS. 4 and 5 are enlarged views of the shutter 17 according to this embodiment.

The shutter 17 is formed by bonding two plates made of, for example, an aluminum alloy such as teardrop-shaped A5052P or stainless steel. FIG. 4 is a plan view showing the interior of the shutter 17 in its lower portion with respect to the heating mechanism B. FIG. 5 is a plan view showing the interior of the shutter 17 in its upper portion with respect to the heating mechanism B.

The arrangement of a lower portion 31 (which lies on the side of the substrate holder mechanism A when the substrate holder mechanism A lowers, and will be referred to as a lower shutter plate 32 hereinafter) of the shutter 17 will be explained with reference to FIG. 4.

The lower shutter plate 32 has a U-shaped groove formed in it. A pipe (water pipe) 34 which serves as a cooling unit and is made of stainless (SUS) is fitted in that groove. This structure has the merit of obtaining a cooling effect nearly equivalent to that obtained when the substrate 3 is directly cooled using water, without directly bringing the shutter 17 made of aluminum into contact with the cooling water, and therefore eliminating the concern about corrosion of the shutter 17. Reference numeral 36 denotes a water inlet and outlet. The water pipe 34 has its rotary portion which is bent downward, and its lower connection portion connected to a movable spiral tube (not shown) made of a resin. To form a vacuum seal of the shutter 17 using the lower shutter plate 32 together with another upper shutter plate 42 which forms the shutter 17, a groove 33 to accommodate an O-ring made of fluorocarbon rubber is formed in the lower shutter plate 32. Reference numeral 35 denotes each hole to insert a machine screw or a bolt.

Furthermore, to prevent the shutter 17 from drooping under its own weight, a countersunk portion (not shown) may be formed at the central portion of the shutter 17 on the side of the substrate holder to reduce the weight of the shutter 17. The countersunk portion is preferably formed to have a heat-absorbing surface as a heat-resistant black surface in order to efficiently cool the substrate 3 when the shutter 17 retracts so as to rapidly cool the substrate stage 1 and the substrate 3 on the substrate stage 1.

The heat absorbing surface can be obtained not only by forming a wall surface from a black material such as black alumite but also by carbon coating using, for example, glassy carbon, pyrolytic carbon, or amorphous carbon.

The structure of an upper portion 41 of the shutter 17 according to this embodiment will be described with reference to FIG. 5.

Like the lower shutter plate 32, the upper shutter plate 42 is made of, for example, teardrop-shaped aluminum (A5052P). Also, the upper shutter plate 42 has a sealing surface 43 formed in it so as to form a vacuum seal inside the upper shutter plate 42 by inserting, as a sealing member, an O-ring made of, for example, fluorocarbon rubber between the lower shutter plate 32 and the upper shutter plate 42. In other words, the water pipe 34 or the like serving as a cooling unit is formed inside the sealing surface 43 (the water pipe 34 has its outer periphery which is surrounded by and built in a sealing member such as an O-ring). Reference numeral 44 denotes a hole in which to insert a machine screw or a bolt.

The O-ring inside the shutter 17 is provided in order to prevent the water pipe 34 in the shutter 17 from being directly subjected to a vacuum (the O-ring insulates the water pipe 34 against its surrounding vacuum state). Although the shutter 17 is set in a vacuum, a fluctuation in pressure applied to the water pipe 34 is reduced by embedding the water pipe 34 inside the shutter 17 to fall within the region surrounded by the O-ring to prevent any water leakage attributed to its deterioration, thus enhancing the reliability of the substrate processing apparatus.

Further, the surface (on the side of the heating mechanism B) of the upper shutter plate 42 is finished into a mirror surface with $\nabla 0.2$ so as to serve as a heat reflecting surface which efficiently reflects heat radiated from the heating mechanism B above the upper shutter plate 42. Note that "$\nabla 0.2$" exemplifies the degree of finish of mirror surface polishing using the surface roughness of the upper shutter plate 42, and means that the upper shutter plate 42 is finished to have an arithmetic average roughness Ra of 0.2 μm.

From the foregoing description, the water pipe 34 of the shutter 17 serves as a cooling unit, which cools the substrate 3 from the upper side of the substrate 3. In addition, since the cooling panel 6 cools the reflecting plates 5 and radiating plates 4, the substrate 3 cools from the lower side of the substrate 3 as well as through the reflecting plates 5 and radiating plates 4. In this manner, the cooling efficiency can be improved by cooling the substrate 3 from both its upper and lower sides.

The shutter 17 is formed by bonding, the surface of the shutter 17 in its lower portion shown in FIG. 4 and that of the shutter 17 in its upper portion shown in FIG. 5, using machine screws, bolts, and nuts.

The chamber D is a housing made of, for example, an aluminum alloy, and includes a water cooling channel 19 for the water cooling mechanism formed in its wall. The chamber D also includes a slit valve 20 and exhaust port 21. The slit valve 20 opens/closes in loading and unloading the substrate 3. The exhaust port 21 is connected to an exhaust system in order to evacuate the interior of the chamber D.

The chamber D includes a first room 22 on the lower side and a second room 23 which continuously lies above the first room 22. The heating mechanism B is placed in the second room 23, positioned in the upper portion of the chamber D, such that the heat radiating surface 2 faces downward. The substrate holder mechanism A can lift/lower between the first room 22 and the second room 23. When the substrate holder mechanism A lifts, it brings the substrate stage 1 close to the heat radiating surface 2 of the heating mechanism B while the first room 22 and the second room 23 are partitioned by the cooling panel 6, as shown in FIG. 2. When the substrate 3 is heated in this state, heat generated in the second room 23 leaks to the first room 22 below the second room 23. This makes it possible to more rapidly cool the substrate 3 upon lowering the substrate holder mechanism A to the first room 22 after the heating. Also, the inner surface of the chamber D, and especially, the inner surface of the second room 23 preferably undergo a mirror finish so as to improve the heating efficiency.

The lift device E includes the lift shaft 12, a lift arm 24, and a ball screw 25. The lift shaft 12 has its upper end connected to the cooling panel 6 of the substrate holder mechanism A. The lift arm 24 is attached to the lower end of the lift shaft 12. The ball screw 25 threadably engages with the lift arm 24. The lift device E also includes a rotation driving device 26 and bellows cover 27. The rotation driving device 26 can rotate the ball screw 25 in both the forward and reverse directions. The bellows cover 27 covers a slide portion between the lift shaft 12 and the chamber D to increase the airtightness in the chamber D, and stretches/contracts upon vertical movement of the lift shaft 12. The lift device E rotates the ball screw 25 in the forward or reverse direction by the rotation driving device 26 to lift or lower the lift arm 24 which is threadably engaging with the ball screw 25, and vertically slides the lift shaft 12 in synchronism with the lifting or lowering, thereby lifting or lowering the substrate holder mechanism A.

A substrate annealing method using a substrate processing apparatus including the shutter 17 according to this embodiment will be explained next.

First, as shown in FIG. 1, the slit valve 20 is opened to load a substrate 3 into the chamber D. As will be described hereinafter, a substrate 3 can be loaded by, for example, carrying the substrate 3 into the chamber D by a robot (not shown), and mounting and supporting the substrate 3 on the lift pins 8, as shown in FIG. 1.

The slit valve 20 of the chamber D is normally connected to a load/unload lock chamber (not shown) via a transfer room (not shown) which accommodates the robot. A substrate 3 is set in the load/unload lock chamber first. After roughing evacuation in the load/unload lock chamber, it is opened to the transfer room and is further evacuated. Then, the slit valve 20 is opened, and the substrate transport robot (not shown) in the transfer room mounts the substrate 3 from the load/unload lock chamber onto the lift pins 8 by a pick-and-place operation.

At this time, the substrate mounting portion of the robot is preferably made of carbon or ceramics so as to have resistance to high temperatures. In addition, to prevent the robot from being blown by radiant heat from the heat radiating surface 2 of the heating mechanism B, the shutter 17 preferably extends into the space between the substrate stage 1 and the substrate 3.

After the robot retracts, the slit valve 20 closes, and the interior of the chamber D is set as an independent vacuum room, the shutter 17 retracts and the substrate holder mechanism A lifts. After the substrate 3 is picked up by the substrate mounting portion (substrate mounting surface) of the substrate stage 1, the substrate holder mechanism A further lifts to bring the substrate stage 1 of the substrate holder mechanism A close to the heat radiating surface 2 of the heating mechanism B, as shown in FIG. 2. At this time, the substrate 3 is not in contact with the heat radiating surface 2.

Although the substrate stage 1 can be in contact with the heat radiating surface 2, both the substrate stage 1 and the substrate 3 on the substrate stage 1 are preferably not in contact with the heat radiating surface 2. The interval between the heat radiating surface 2 and the substrate 3 is preferably 1 to 25 mm, depending on, for example, the sizes of the heat radiating surface 2 and substrate 3, the heating temperature, and the heating power of the heating mechanism B.

The heater of the heating mechanism B is turned on to heat the substrate 3 by radiant heat from the heat radiating surface 2. When the heating temperature is, for example, 1,900° C., the heating mechanism B continues heating until the temperature of the substrate stage 1 measured by the temperature measurement device 14 reaches 1,900° C. After that temperature reaches 1,900° C., this temperature value is kept for a predetermined annealing time (e.g., about 1 min).

After the elapse of the annealing time, the heater of the heating mechanism B is turned off to start natural cooling. At the same time, the substrate holder mechanism A lowers to the above-mentioned cooling position, and the shutter 17 extends into the space between the substrate stage 1 of the substrate holder mechanism A and the heat radiating surface 2 of the heating mechanism B, thereby enhancing cooling. After the substrate 3 cools to a temperature (e.g., 200° C.) at which the substrate 3 can be removed with no problem, the substrate holder mechanism A lowers to the above-mentioned load/unload position.

While the substrate holder mechanism A lowers from the cooling position to the load/unload position, the substrate 3 is transferred onto the lift pins 8 and so becomes ready to be removed. After the substrate holder mechanism A lowers to the load/unload position, the slit valve 20 is opened to remove the substrate 3 by the robot in the transfer room (not shown).

Assume that both the substrate holder mechanism A and the heating mechanism B are liftable. In this case, it is possible to set a sufficiently large distance between them in cooling by vertically extending the second room 23 according to this embodiment. In other words, it is possible to improve the cooling efficiency by lowering the substrate holder mechanism A and lifting the heating mechanism B after heating at the position described with reference to FIG. 2, and by increasing the distance between the substrate stage 1 and the substrate 3 on it and the heat radiating surface 2 in cooling the substrate 3. Assume that only the heating mechanism B is liftable. In this case, it is necessary to omit the lift pins 8 or provide a separate mechanism for vertically moving the lift pins 8, and this makes cooling at the above-mentioned cooling position difficult. Nevertheless, in this case, it is possible to yield the basic benefit as in the above-mentioned example.

Embodiment

An embodiment of an activation annealing process for a substrate 3 containing ion-implanted silicon carbide (SiC) when the above-mentioned embodiment is adopted will be described next as a semiconductor device manufacturing method.

The substrate 3 was a substrate containing 4H single-crystal silicon carbide. The substrate 3 was used after forming an n-type epitaxial layer with a thickness of 10 μm on the substrate 3 by chemical vapor deposition (CVD), and sacrificially oxidizing the substrate 3 in an oxygen ($O_2$) atmosphere at 900° C. for 30 min by an oxidation furnace so that it has a film thickness of 10 nm.

After the substrate 3 had undergone a hydrofluoric acid treatment to expose its clean surface, a 10-nm thick oxide film for protection during ion implantation was formed under the same condition as above in the oxidation furnace. Then, using an ion implanter, the substrate 3 was heated to 500° C., and aluminum was implanted into the substrate 3 as an impurity with six-step implantation energies of 40, 100, 200, 350, 500, and 700 keV so that the aluminum formed a box shaped profile with a concentration of $2.0 \times 10^{18}/cm^3$.

After the ion-implanted protective film was removed by hydrofluoric acid, the substrate 3 was annealed by the above-mentioned substrate processing apparatus.

While a shutter 17 was closed, the substrate 3 was mounted on a substrate stage 1 by the robot (not shown). Then, the shutter 17 opened (retracted) to lift the substrate stage 1 to the position where the substrate 3 underwent a predetermined annealing process. In this state, the substrate 3 was heated to 2000° C. at an acceleration voltage of 2.3 kV, and annealed for 1 min. After the annealing process, a heating mechanism B was powered off, the substrate stage 1 lowered, the shutter 17 closed, and the substrate 3 and a substrate holder mechanism A cooled rapidly.

The times required for respective processes were a total of 15 min: a heat-up time of 6 min, an annealing time of 1 min, a cooling time of 5 min, and a substrate exchange time of 3 min. Hence, the number of substrates processed per hour could be improved to 4.0 (sheets/hr).

Also, to evaluate the surface flatness of the annealed substrate 3, the substrate 3 was measured over the measurement range of 4 μm×4 μm in a tapping mode by an atomic force microscope (AFM). The measurement result revealed that the RMS value representing the surface flatness of the substrate 3 was 0.6 nm, that is, the substrate 3 was very flat. Note that the RMS is the root-mean-square roughness. Then, after the surface of the substrate 3 was removed by 40 nm using sacrificial oxidation and dry etching, an aluminum electrode was formed using lift-off, and the activation rate of aluminum was calculated by CV measurement. The calculation result revealed that an activation rate of 100% was obtained, that is, the aluminum was sufficiently activated.

In this embodiment, the heating mechanism B heats up from room temperature. However, the heat-up time can be shortened by preheating the heating mechanism B while the shutter mechanism C is closed. Also, when a robot with high heat resistance is used or a heat-insulating material is used for the contact portion between the robot and the substrate, the substrate can be transported at even high temperatures. Further, the number of substrates processed per hour can be further improved by setting a higher robot speed.

The substrate processing apparatus according to this embodiment mounts a substrate on the substrate holder mechanism A, and supports a shutter, including a cooling pipe fitted in it, by a vacuum heating/cooling device which heats the substrate by radiation from its upper side. This arrangement can achieve a productivity high enough to allow the substrate processing apparatus to satisfactorily function as a semiconductor device manufacturing apparatus at low cost by attaining high-quality activation of an impurity implanted into silicon carbide (SiC) free from any heavy-metal contamination.

Although a case in which the substrate 3 is a silicon carbide (SiC) substrate has been explained as an embodiment of the present invention, the present invention is not limited to this embodiment, as a matter of course. However, note that a silicon carbide (SiC) substrate requires an annealing temperature higher than that for, for example, an Si substrate, and, in turn, requires efficient heating/cooling. Hence, the present invention is preferably adopted in that case.

The present invention can be preferably adopted for a substrate processing apparatus and substrate annealing method used in annealing substrates such as a silicon carbide (SiC) substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-318426, filed Dec. 15, 2008, Japanese Patent Application No. 2009-278040, filed Dec. 7, 2009, which are hereby incorporated by reference herein in their entirety.

What is claimed is:

1. A substrate processing apparatus comprising:
a chamber capable of being evacuated;
a substrate stage adapted to, in the chamber, mount a substrate;
a heating unit adapted to, in the chamber, be set above a substrate mounting surface of the substrate stage, face the substrate mounted on at least the substrate mounting surface, and heat the substrate by radiant heat without being in contact with the substrate;
a shutter adapted to, in the chamber, be retractably inserted in a space between the heating unit and the substrate mounted on the substrate mounting surface; and
a shutter driving unit adapted to, in the chamber, extend/retract the shutter into/from the space,
wherein the shutter has a first principal surface serving as a heat reflecting surface, and a second principal surface serving as a heat absorbing surface,
wherein the shutter is disposed such that said first principal surface faces the heating unit and said second principal surface faces the substrate stage when the shutter extends into the space, and
wherein the shutter includes a first cooling unit adapted to have an outer periphery surrounded by a sealing member.

2. The apparatus according to claim 1, further comprising:
a driving unit adapted to, in the chamber, lift the substrate stage toward the heating unit in heating the substrate and lower the substrate stage after heating the substrate.

3. A substrate processing apparatus comprising:
a chamber capable of being evacuated;
a substrate stage adapted to, in the chamber, mount a substrate;
a heating unit adapted to, in the chamber, be set above a substrate mounting surface of the substrate stage, face the substrate mounted on at least the substrate mounting surface, and heat the substrate by radiant heat without being in contact with the substrate;
a shutter adapted to, in the chamber, be retractably inserted in a space between the heating unit and the substrate mounted on the substrate mounting surface; and
a shutter driving unit adapted to, in the chamber, extend/retract the shutter into/from the space;
wherein the shutter has a first principal surface serving as a heat reflecting surface, and a second principal surface serving as a heat absorbing surface,
wherein the shutter is disposed such that said first principal surface faces the heating unit and said second principal surface faces the substrate stage when the shutter extends into the space,
wherein the shutter includes a first cooling unit adapted to have an outer periphery surrounded by a sealing member, and
wherein the substrate stage includes a second cooling unit adapted to be positioned on a side opposite to a side on which the heating unit is disposed with respect to the substrate stage.

4. The apparatus according to claim 3, further comprising:
a heat storage unit adapted to, in the chamber, be positioned on a side opposite to a side on which the heating unit is disposed with respect to the substrate stage,
wherein said heat storage unit is inserted between the substrate storage stage and said second cooling unit.

5. A substrate annealing method, the method comprising the steps of:
(a) mounting a substrate on a substrate stage to face a heating unit;
(b) annealing the substrate, mounted on the substrate stage, by heating the substrate by radiant heat from the heating unit; and
(c) extending a shutter, having a surface that faces the substrate stage and is cooled, into the space between the heating unit and the substrate stage after the substrate undergoes the annealing.

6. The method according to claim 5, further comprising:
(i) lifting the substrate stage toward the heating unit after the substrate is mounted on the substrate stage in the mounting step; and
(ii) lowering the substrate stage with respect to the heating unit after the substrate is heated and undergoes the annealing in the annealing step,
wherein in the extending step, the shutter, having a surface that faces the substrate stage and is cooled using water, is extended after the lowering of the substrate stage is completed in the lowering step.

7. A semiconductor device manufacturing method comprising:
a step of annealing a substrate using a substrate annealing method defined in claim 5.

* * * * *